(12) United States Patent
Ito

(10) Patent No.: US 10,304,712 B2
(45) Date of Patent: May 28, 2019

(54) TRANSPORT CONTAINER AND TRANSFER METHOD FOR STORED OBJECT

(71) Applicant: MURATA MACHINERY, LTD., Kyoto-shi, Kyoto (JP)

(72) Inventor: Yasuhisa Ito, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 15/667,748

(22) Filed: Aug. 3, 2017

(65) Prior Publication Data
US 2018/0061693 A1     Mar. 1, 2018

(30) Foreign Application Priority Data

Aug. 26, 2016   (JP) ................. 2016-165606

(51) Int. Cl.
| | |
|---|---|
| *B65G 47/64* | (2006.01) |
| *H01L 21/677* | (2006.01) |
| *H01L 21/67* | (2006.01) |
| *H01L 21/673* | (2006.01) |

(52) U.S. Cl.
CPC ...... *H01L 21/67718* (2013.01); *B65G 47/641* (2013.01); *H01L 21/6773* (2013.01); *H01L 21/67259* (2013.01); *H01L 21/67353* (2013.01); *H01L 21/67359* (2013.01); *H01L 21/67369* (2013.01); *H01L 21/67383* (2013.01); *H01L 21/67386* (2013.01); *H01L 21/67715* (2013.01); *H01L 21/67706* (2013.01); *H01L 21/67793* (2013.01)

(58) Field of Classification Search
CPC .. B65G 47/641; B65G 47/642; B65G 47/643; H01L 21/67718; H01L 21/67383

USPC ......... 414/222.08, 222.11, 222.12, 807, 808, 414/288, 937
See application file for complete search history.

(56) References Cited

U.S. PATENT DOCUMENTS

| | | | | |
|---|---|---|---|---|
| 4,790,750 | A * | 12/1988 | Bourel ...... | C23C 8/36 414/217 |
| 5,853,532 | A * | 12/1998 | Nakamura ...... | H01L 21/67144 156/758 |
| 5,855,465 | A * | 1/1999 | Boitnott ...... | H01L 21/67745 204/298.25 |
| 5,976,199 | A * | 11/1999 | Wu ...... | H01L 21/67017 29/25.01 |
| 6,470,927 | B2 * | 10/2002 | Otaguro ...... | H01L 21/67772 141/65 |
| 6,568,896 | B2 * | 5/2003 | Franklin ...... | H01L 21/67017 414/217 |

(Continued)

FOREIGN PATENT DOCUMENTS

WO     2016/027558 A1     2/2016

*Primary Examiner* — Joseph A Dillon, Jr.
(74) *Attorney, Agent, or Firm* — Keating & Bennett, LLP

(57) ABSTRACT

A transport container, in which a stored object is taken in and out through an opening on a side surface, includes a positioner that projects upward from an outside of a placement surface of the stored object on a storage portion where the stored object is placed, and a regulator movable between an advanced position, in which the regulator is advanced to above the stored object placed on the placement surface to regulate upward movement of the stored object, and a retracted position, in which the regulator is retracted from above the stored object to allow upward movement of the stored object.

9 Claims, 15 Drawing Sheets

(56) References Cited

U.S. PATENT DOCUMENTS

| | | | | |
|---|---|---|---|---|
| 6,609,877 B1* | 8/2003 | Ramsay | H01L 21/67126 | 414/217 |
| 6,758,647 B2* | 7/2004 | Kaji | G05B 19/042 | 414/217 |
| 6,824,343 B2* | 11/2004 | Kurita | H01L 21/68 | 414/217 |
| 6,848,882 B2* | 2/2005 | Chen | H01L 21/67763 | 414/217.1 |
| 6,979,168 B2* | 12/2005 | Uchimaki | H01L 21/67276 | 414/217.1 |
| 7,735,710 B2* | 6/2010 | Kurita | H01L 21/68 | 228/49.4 |
| 7,806,648 B2* | 10/2010 | Ito | B65G 47/52 | 414/416.05 |
| 7,887,277 B2* | 2/2011 | Campbell | H01L 21/67276 | 414/217 |
| 8,205,558 B2* | 6/2012 | Horn | H01L 21/67769 | 104/91 |
| 8,231,005 B2* | 7/2012 | Kolbow | G03F 1/66 | 206/710 |
| 8,977,387 B2* | 3/2015 | Wang | H01L 21/67763 | 700/228 |
| 9,664,335 B2* | 5/2017 | Ogo | H01L 21/67379 | |
| 9,991,144 B2* | 6/2018 | Adachi | H01L 21/67769 | |
| 2001/0052392 A1* | 12/2001 | Nakamura | H01L 21/681 | 156/345.31 |
| 2002/0090836 A1* | 7/2002 | Sik | H01L 21/6719 | 216/38 |
| 2004/0083955 A1* | 5/2004 | Ramsay | H01L 21/67126 | 118/500 |
| 2005/0120956 A1* | 6/2005 | Suzuki | C23C 14/50 | 118/719 |
| 2005/0232727 A1* | 10/2005 | Ferrara | H01L 21/67201 | 414/217 |
| 2006/0137988 A1* | 6/2006 | Yahashi | H01J 37/32642 | 205/82 |
| 2007/0284217 A1 | 12/2007 | Ito | | |
| 2008/0224374 A1* | 9/2008 | Hasuda | G03F 1/72 | 269/71 |
| 2009/0002966 A1* | 1/2009 | Hosokawa | H01L 21/67383 | 361/809 |
| 2009/0087285 A1* | 4/2009 | Mitsuyoshi | H01L 21/67766 | 414/217 |
| 2009/0238664 A1 | 9/2009 | Murata et al. | | |
| 2010/0279439 A1* | 11/2010 | Shah | H01L 21/67155 | 438/15 |
| 2011/0097518 A1* | 4/2011 | Olgado | C23C 16/4587 | 427/575 |
| 2011/0097878 A1* | 4/2011 | Olgado | C23C 16/4587 | 438/478 |
| 2012/0128455 A1 | 5/2012 | Tsubaki et al. | | |
| 2012/0200835 A1* | 8/2012 | Suzuki | G03F 1/66 | 355/30 |
| 2012/0275886 A1* | 11/2012 | Ota | H01L 21/67733 | 414/222.08 |
| 2013/0284924 A1* | 10/2013 | Mizuochi | G01N 23/2206 | 250/310 |
| 2015/0332930 A1* | 11/2015 | Wang | H01L 21/6708 | 438/719 |
| 2016/0090239 A1* | 3/2016 | Iwasaki | H01L 21/67733 | 414/267 |
| 2016/0159021 A1* | 6/2016 | Pulici | B29C 31/08 | 156/110.1 |
| 2017/0011921 A1* | 1/2017 | Shibagaki | H01L 21/3247 | |
| 2017/0301540 A1* | 10/2017 | Hashimoto | H01L 21/02 | |
| 2018/0190535 A1* | 7/2018 | Weaver | H01L 21/67196 | |
| 2019/0055093 A1* | 2/2019 | Chi | B65G 47/643 | |

* cited by examiner

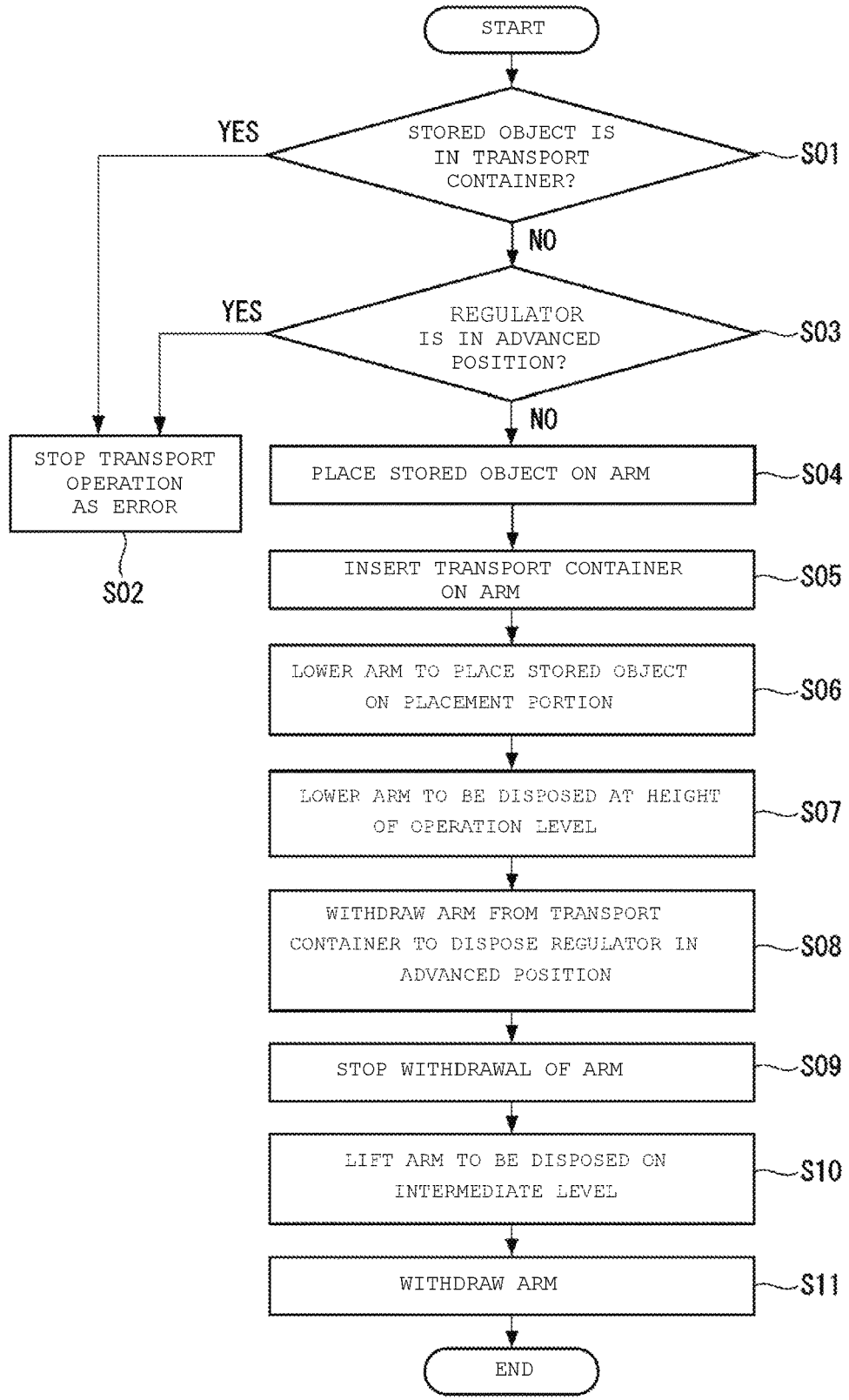

FIG. 12A
FIG. 12B
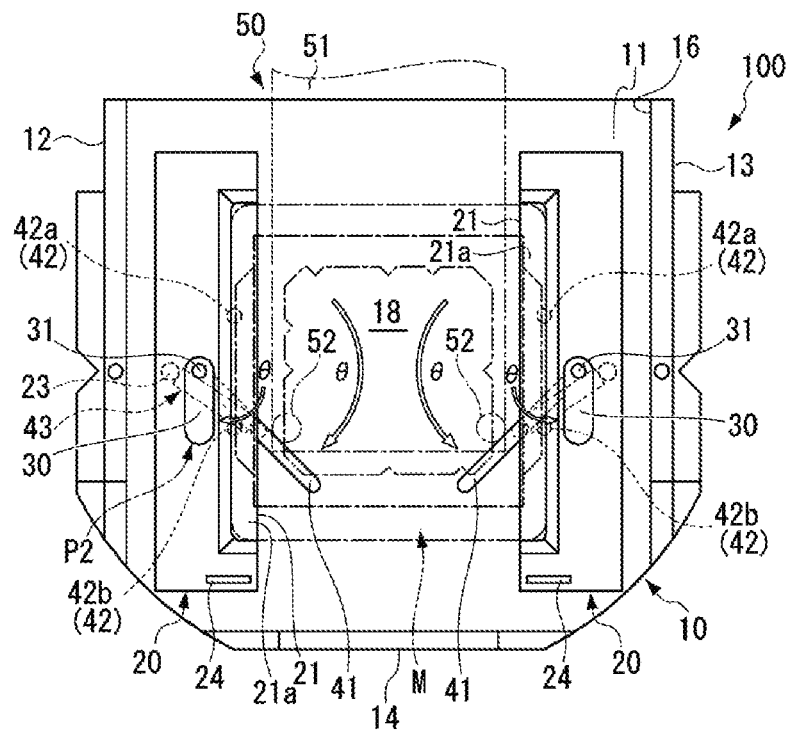
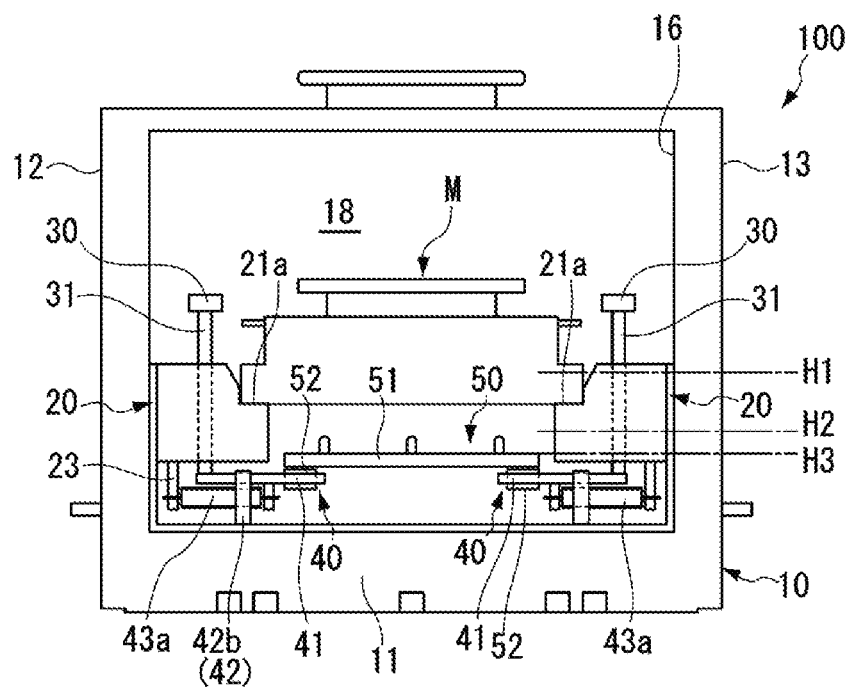

TRANSPORT CONTAINER AND TRANSFER METHOD FOR STORED OBJECT

CROSS REFERENCE TO RELATED APPLICATIONS

This application claims the benefit of priority to Japanese Patent Application No. 2016-165606 filed on Aug. 26, 2016. The entire contents of this application are hereby incorporated herein by reference.

BACKGROUND OF THE INVENTION

1. Field of the Invention

The present invention relates to a transport container and a transfer method for a stored object.

2. Description of the Related Art

In a manufacturing factory such as a semiconductor manufacturing factory, for example, a desired article is stored into a transport container, such as a FOUP (Front-Opening Unified Pod) for storing semiconductor wafers or a reticle Pod for storing a reticle, and the container is transported by a vehicle or the like. The FOUP and reticle Pod are transported by respective dedicated transport systems, but it is known that, by storing the reticle Pod into the FOUP and then transporting the FOUP, the reticle Pod is transported using the transport system for the FOUP (e.g., see Japanese Patent No. 4,200,387).

Since a transport container (a FOUP) described in Japanese Patent No. 4,200,387 has a stored object (a reticle Pod) placed in a storage portion in the container, the stored object may fall from a predetermined position in the storage portion due to shaking, vibration, or the like of the transport container during transport, thus causing damage to the stored object (or the reticle in the reticle Pod being the stored object, etc.), which has been problematic.

SUMMARY OF THE INVENTION

In view of such circumstances, preferred embodiments of the present invention provide transport containers and transfer methods for a stored object which are capable of preventing the stored object from falling from a storage portion in the transport container, to prevent damage and the like on the stored object in an easy and reliable manner.

A transport container according to a preferred embodiment of the present invention is a transport container in which a stored object is taken in and out through an opening on a side surface. The transport container includes a positioner that projects upward from an outside of a placement surface of the stored object in a storage portion where the stored object is placed; and a regulator movable between an advanced position, in which the regulator is advanced to above the stored object placed on the placement surface to regulate upward movement of the stored object, and a retracted position, in which the regulator is retracted from above the stored object to allow upward movement of the stored object.

Further, the regulator may turn or move between the advanced position and the retracted position above the positioner. The transport container may include an operation member that is connected to the regulator and moves the regulator to the advanced position or the retracted position. The operation member may be operated by a transfer device that takes the stored object into and out of the storage portion. The operation member may be disposed below a height of the transfer device that takes the stored object in and out. The transport container may include an elastic member that elastically supports the operation member and holds the regulator in the advanced position or the retracted position. The regulator in at least one of the advanced position and the retracted position may be detected by a detector of the transfer device. The regulator may block detection light, which is emitted from the detector, in the advanced position, and allow the detection light to pass in the retracted position. The transport container may include a reflector that reflects the detection light, which is allowed to pass, when the regulator is in the retracted position.

A transfer method for a stored object according to a preferred embodiment of the present invention is a method for transferring a stored object through an opening on a side surface of a transport container, the transport container including a positioner that projects upward from an outside of a placement surface of the stored object in a storage portion where the stored object is placed, and a regulator movable between an advanced position, in which the regulator is advanced to above the stored object placed on the placement surface to regulate upward movement of the stored object, and a retracted position, in which the regulator is retracted from above the stored object to allow upward movement of the stored object. The method includes switching the regulator to the advanced position or the retracted position by a portion of the transfer device when the stored object is taken into or out of the storage portion by the transfer device.

In a transport container according to a preferred embodiment of the present invention, disposing the regulator in the retracted position enables the stored object to be taken in and out. By disposing the regulator in the advanced position, the stored object is able to be easily and reliably prevented from falling from the storage portion due to shaking, vibration, or the like of the transport container during transport of the transport container or the like.

In a transport container in which the regulator moves or turns between the advanced position and the retracted position above the positioner, since the regulator moves between the advanced position and the retracted position by such a simple turning operation of the regulator, it is possible to facilitate switching of the position of the regulator. In the transport container including the operation member that is connected to the regulator and moves the regulator to the advanced position or the retracted position, the regulator is able to be moved by operating the operation member. In the transport container in which the operation member is operated by the transfer device that takes the stored object into and out of the storage portion, additional provision of a dedicated actuator or the like is not required, thus enabling prevention of an increase in manufacturing cost of the transport container. In the transport container in which the operation member is disposed below the height of the transfer device that takes the stored object in and out, since the operation member is able to be operated in a position displaced from a track of the transfer device currently taking the stored object in or out, it is possible to prevent erroneous operation of the operation member while the stored object is being taken in or out.

In the transport container including the elastic member that elastically supports the operation member and holds the regulator in the advanced position or the retracted position, the regulator is able to be reliably held in the advanced position or the retracted position by elastic force of the operation member. In the transport container in which the regulator in at least one of the advanced position and the retracted position is detected by a detector of the transfer device, the position of the regulator is confirmed by the detector, and it is thus possible to avoid contact between the regulator and the stored object and reliably take the stored object in and out. In the transport container in which the regulator is structured to block detection light, which is emitted from the detector, in the advanced position, and allow the detection light to pass in the retracted position, the position of the regulator is able to be reliably detected by using the detection light. In the transport container including the reflector that reflects the detection light, which is allowed to pass, when the regulator is in the retracted position, the detector detects the light reflected by the reflector, thus enabling reliable detection that the regulator is in the retracted position.

In a transfer method for the stored object according to a preferred embodiment of the present invention, disposing the regulator in the retracted position enables the stored object to be taken in and out. Further, by disposing the regulator in the advanced position, the stored object is able to be easily and reliably prevented from falling from the storage portion.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a plan view, and FIG. 1B is a sectional view taken along line A-A.

FIG. 3A is a state where a regulator has not been detected, and FIG. 3B is a state where a regulator has been detected.

FIG. 4 is a flowchart illustrating an example of an operation to take the stored object in.

FIGS. 12A and 12B are views illustrating a state where an operation member has been operated by the arm.

DETAILED DESCRIPTION OF THE PREFERRED EMBODIMENTS

Figure 1A:
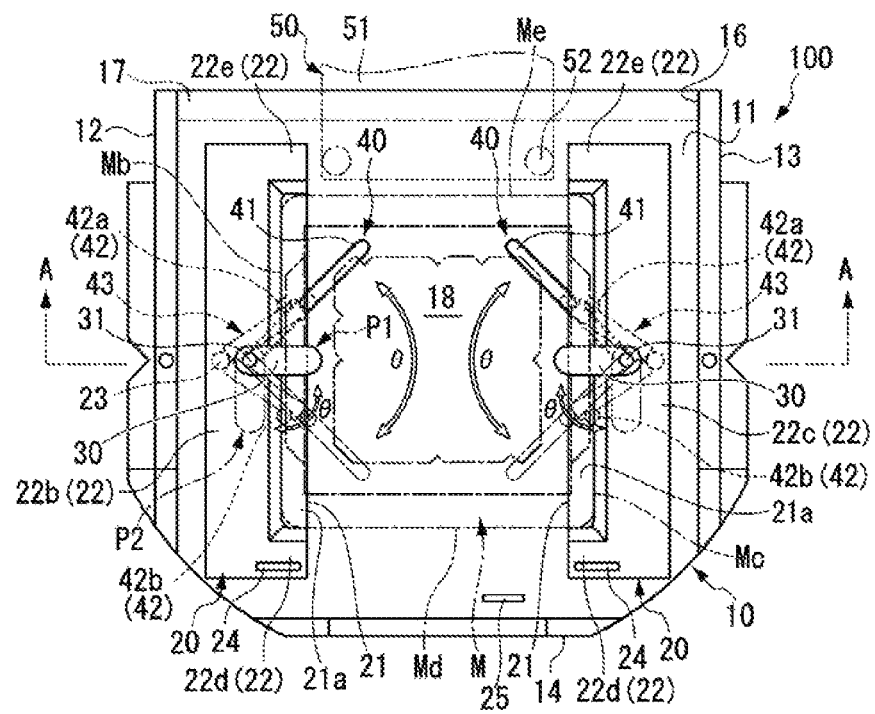
FIGS. 1A and 1B illustrate an example of a transport container according to a preferred embodiment of the present invention, where

Hereinafter, preferred embodiments of the present invention will be described with reference to the drawings. However, the present invention is not limited thereto. In the drawings, illustration is made with an appropriate change in scale size, such as partial enlargement or emphasis, so as to describe the preferred embodiments. Further, a vertical direction and a horizontal direction in the following description are a vertical direction and a horizontal direction of a transport container 100, with the transport container 100 in a normal usage state taken as a reference.

Figure 1B:
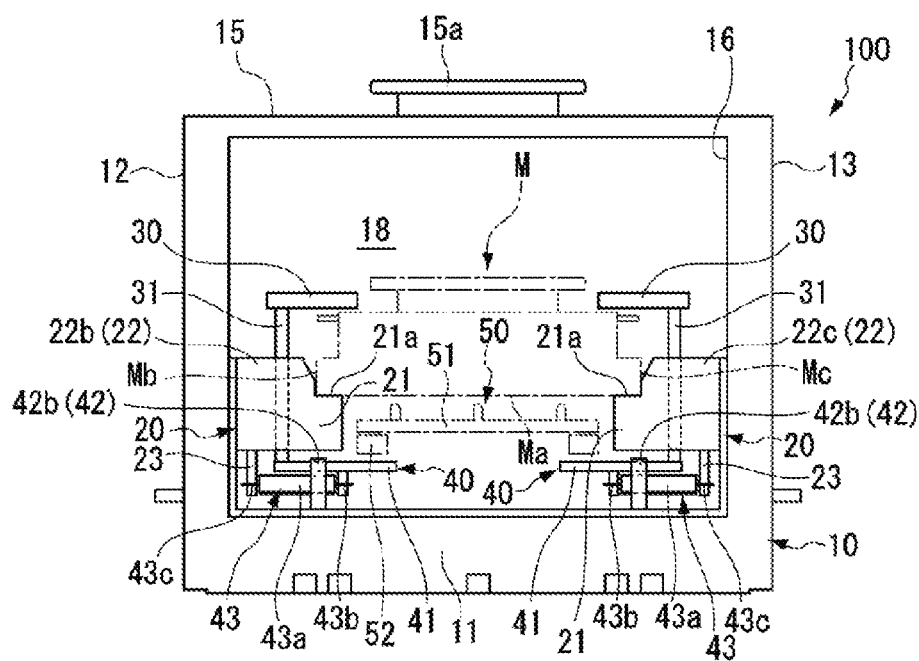

FIGS. 1A and 1B illustrate an example of the transport container 100 according to the present preferred embodiment, FIG. 1A is a plan view, and FIG. 1B is a sectional view taken along line A-A in FIG. 1A. As illustrated in FIGS. 1A and 1B, the transport container 100 stores a stored object M transferred by an arm 51 of a transfer device 50 described later, and transported by a transport system, not illustrated. The stored object M can be exemplified by a reticle Pod, but is not particularly limited thereto. The stored object M can enter inside the transport container 100, while being mounted on the arm 51.

The transport container 100 includes a body 10, positioners 20, regulators 30, and operation members 40. The body includes a bottom surface 11, side surfaces 12, 13, a back surface 14, and a top surface 15. The bottom surface 11 is in a tabular shape defining the bottom surface of the body 10. The side surfaces 12, 13 on the side surfaces of the body 10 are disposed parallel or substantially parallel to each other, the side surfaces 12, 13 both having the tabular shape and being disposed vertically to the bottom surface 11. The back surface 14 is disposed on the back surface of the body 10 and has a plate shape with a bent or warped portion. The back surface 14 is connected with the side surfaces 12, 13 and disposed vertically to the bottom surface 11. The top surface 15 is disposed on the top surface of the body 10 and has a tabular shape. The top surface 15 is connected with the upper portions of the side surfaces 12, 13 and the back surface 14. The top surface 15 includes a flange 15a for transport in approximately the central portion.

Further, the body 10 includes an opening 16 and a lid 17. The opening 16 is located on the front surface side of the body 10. The opening 16 is large enough to allow passage of the arm 51 of the transfer device 50 placed with the stored object M. The lid 17 is removably provided to the opening 16. Note that whether or not to provide the lid 17 can be freely selected, and the lid 17 may not be provided. Further, the body 10 includes therein a storage portion 18. The storage portion 18 holds the stored object M, with the stored object M placed on a placement surface 21a described later.

The positioners 20 are provided in the storage portion 18. The positioners 20 horizontally position the stored object M placed in the storage portion 18. Each of the positioners 20 is separated from each of the side surfaces 12, 13. The paired positioners 20 are disposed with a space therebetween, where the arm 51 of the transfer device 50 passes. The positioner 20 includes a support 21 and a projection 22. The support 21 is disposed separately from the bottom surface 11. Each of the supports 21 includes a placement surface 21a with flat shape. The two placement surfaces 21a are each in contact with a bottom surface Ma of the stored object M.

The projection 22 is in contact with the side surface of the stored object M supported by the placement surface 21a. The projection 22 is disposed on the outside of the placement surface 21a and projects above the placement surface 21a. The projection 22 includes side surface contact portions 22b, 22c, a back surface contact portion 22d, and a front surface contact portion 22e. The side surface contact portions 22b, 22c are respectively in contact with side surfaces Mb, Mc of the stored object M. The back surface contact portion 22d is in contact with a back surface Md of the stored object M. The front surface contact portion 22e is in contact with a front surface Me of the stored object M. The projection 22 is in contact with the side surfaces Mb, Mc, the back surface Md, and the front surface Me of the stored object M, to regulate horizontal movement of the stored object M to perform positioning.

The upper portion of each of the side surface contact portions 22b, 22c, the back surface contact portion 22d, and the front surface contact portion 22e includes a tapered surface to guide the stored object M at the time of lowering of the stored object M. Further, a light reflector 24 that reflects detection light L, described later, is disposed in the projection 22. The light reflector 24 is disposed on the back surface 14 side of the projection 22. Note that the light reflector 24 may be disposed on the back surface 14 of the body 10 instead of being provided in the projection 22. A light reflector 25 is disposed on the back surface 14 of the body 10.

One each of the regulators 30 is disposed on the upper portion of the positioner 20. The regulator 30 includes a rod-shaped shaft member 31 extending downward. The shaft member 31 is supported rotatably around a vertically parallel axis. The regulator 30 is turnable in a θ-direction around the shaft member 31. The regulator 30 is able to move between an advanced position P1 and a retracted position P2 by turning in the θ-direction.

The advanced position P1 is a position of the regulator 30 having been advanced (projected) to above the stored object M placed on the placement surface 21a. When the regulator 30 is disposed in the advanced position P1 while the stored object M is placed on the placement surface 21a, the stored object M comes into contact with the regulator 30 even when moving upward, and the upward movement of the stored object M is thus regulated. Further, the horizontal movement of the stored object M is regulated by the positioner 20, and hence the positioner 20 and the regulator 30 described above prevent the stored object M from falling from the placement surface 21a.

The retracted position P2 is a position of the regulator 30 having been retracted from above the stored object M placed on the placement surface 21a. In the retracted position P2, the vertical movement of the stored object M is allowed. When the regulator 30 is disposed in the retracted position P2 while the stored object M is placed on the placement surface 21a, the stored object M is able to be moved upward without coming into contact with the regulator 30. Further, when the regulator 30 is disposed in the retracted position P2, it is possible to place the stored object M on the placement surface 21a by moving the stored object M downward from above the placement surface 21a.

The operation member 40 moves the regulator 30 between the advanced position P1 and the retracted position P2. The operation member 40 includes an operation lever 41, a stopper 42, and an elastic support 43. The operation lever 41 has the shape of a rod, and is fitted to the lower portion of the shaft member 31. The operation lever 41 is rotatable in the θ-direction around the shaft member 31. Accordingly, rotating the operation lever 41 in the θ-direction enables turning of the regulator 30 in the θ-direction via the shaft member 31.

The operation lever 41 is operated by the arm 51 of the transfer device 50. Two rollers 52 are provided on the lower surface of the arm 51. Each roller 52 is disposed so as to be able to come into contact with each operation lever 41. By moving the arm 51 in a direction in which the stored object M is taken in and out while the roller 52 is in contact with the operation lever it is possible to rotate the operation lever 41 in the θ-direction. Note that the portion in contact with the operation lever 41 is not limited to the roller 52, but may be the projection, for example. However, the use of the roller 52 reduces friction in operating the operation lever 41, to allow smooth operation of the operation lever 41.

Further, the operation lever 41 is disposed below the positioner 20, as well as below a route which is used when the arm 51 of the transfer device 50 takes the stored object M in and out. Accordingly, by adjusting the height of the arm 51, it is possible to distinguish between a height for taking the stored object M in and out and a height for operating the operation lever 41, and thus to prevent erroneous operation of the operation lever 41 at the time of the arm 51 taking the stored object M in and out.

The stopper 42 regulates a rotating amount of the operation lever 41 in the θ-direction. The stopper 42 includes an advance-side contact portion 42a and a retract-side contact portion 42b. The operation lever 41 is able to move in the θ-direction between the advance-side contact portion 42a and the retract-side contact portion 42b. When the regulator 30 turns in the θ-direction from the retracted position P2 to the advanced position P1, the operation lever 41 comes into contact with the advance-side contact portion 42a so that the regulator 30 does not turn beyond the advanced position P1. Meanwhile, when the regulator 30 turns in the θ-direction from the advanced position P1 to the retracted position P2, the operation lever 41 comes into contact with the retract-side contact portion 42b so that the regulator 30 does not turn beyond the retracted position P2.

The elastic support 43 elastically supports the operation lever 41. The elastic support 43 includes an elastic member 43a and contact ends 43b, 43c. For example, an elastically deformable member such as a coil spring is used for the elastic member 43a. The contact end 43b is connected to the operation lever 41. The contact end 43c is connected to a contact portion 23 which is outside (closer to the side surfaces 12, 13 than) the shaft member 31. The contact portion 23 projects from the lower surface of the support 21.

Since one end of the elastic member 43a is connected to the contact portion 23 described above, the elastic member 43a comes into the most contracted state when the operation lever 41 comes into contact with the advance-side contact portion 42a or comes into contact with the retract-side contact portion 42b, and the elastic member 43a comes into an extended state in the other rotation positions. Thus, by elastic force, the elastic member 43a holds the state of the operation lever 41 being in contact with the advance-side contact portion 42a or the retract-side contact portion 42b. Hence the regulator 30 is held in the state of being disposed in one of the advanced position P1 and the retracted position P2, and even when shaking or vibration occurs in the transport container 100, it is possible to prevent the regulator 30 from unexpectedly turning and moving to the advanced position P1 or the retracted position P2.

Figure 2:
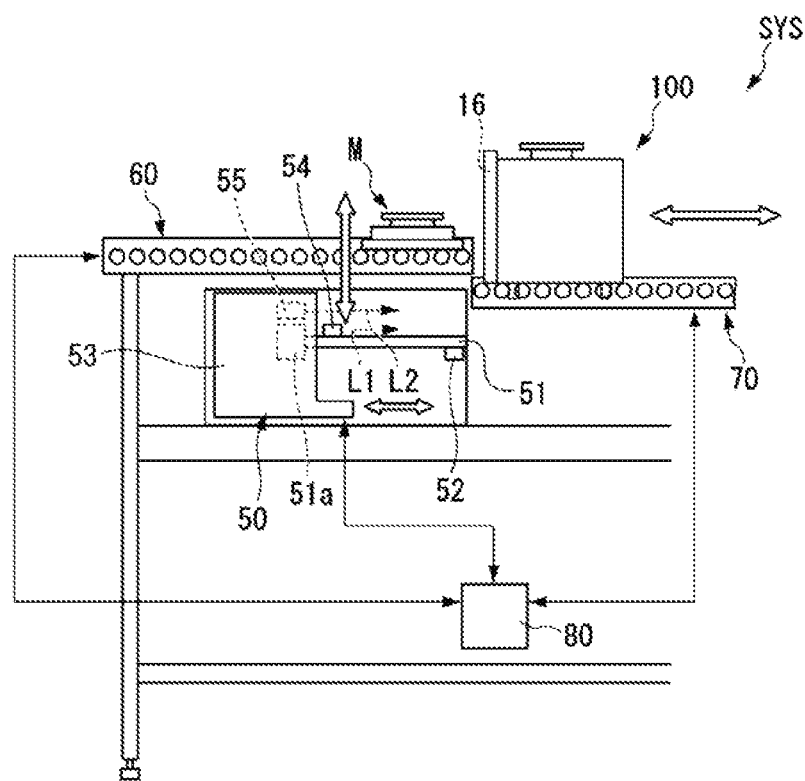
FIG. 2 is a view illustrating an example of a transfer system for transferring a stored object.

FIG. 2 is a view illustrating an example of a transfer system SYS for transferring the stored object M to the transport container 100. As illustrated in FIG. 2, the transfer system SYS includes the transfer device 50, a stored object transporter 60, a container transporter 70, and a controller 80. The transfer device 50 delivers and receives the stored object M to and from the transport container 100. The transfer device 50 includes the arm 51, the roller 52, a body 53, a detector 54, and a stored object detector 55. The arm 51 is a plate body on which the stored object M is able to be placed, and is able to be lifted and lowered by a lifting driver 51a. By lifting and lowering the arm 51, the stored object M is able to be delivered and received to and from the stored object transporter 60. As described above, the roller 52 is preferably located on the lower surface side of the arm 51. The body 53 is horizontally movable by a driver, not illustrated.

The stored object transporter 60 transports the stored object M by using a roller conveyor or the like, for example. The container transporter 70 transports the transport container 100 by using a roller conveyor or the like, for example. The controller 80 integrally controls operations of the transfer device 50, the stored object transporter 60, and the container transporter 70.

The detector 54 detects which position, the advanced position P1 or the retracted position P2, the regulator 30 is disposed in. The detector 54 preferably is provided on the arm 51, for example, but the present invention is not limited thereto, and the detector 54 may be provided on the body 53, for example. The detector 54 has a light emitter and a light receiver. The light emitter emits detection light L1 toward the inside of the transport container 100. The light receiver receives the detection light L1 reflected on the light reflector 24 (cf. FIG. 1). The detector 54 transmits a light reception signal detected in the light receiver to the controller 80. The controller 80 may determine whether or not to continue transfer of the stored object M based on the presence or absence of the light reception signal from the detector 54.

The stored object detector 55 detects whether or not the stored object M has been placed in the storage portion 18. The stored object detector 55 may be provided in the arm 51, or may be provided in the body 53. The stored object detector 55 includes a light emitter and a light receiver. The light emitter emits detection light L2 toward the storage portion 18 of the transport container 100. The light receiver receives the detection light L1 reflected on the light reflector 25 (cf. FIG. 1). The stored object detector 55 transmits the light reception signal detected in the light receiver to the controller 80. The controller 80 may determine whether or not to continue transfer of the stored object M based on the presence or absence of the light reception signal from the stored object detector 55.

Figure 3A:
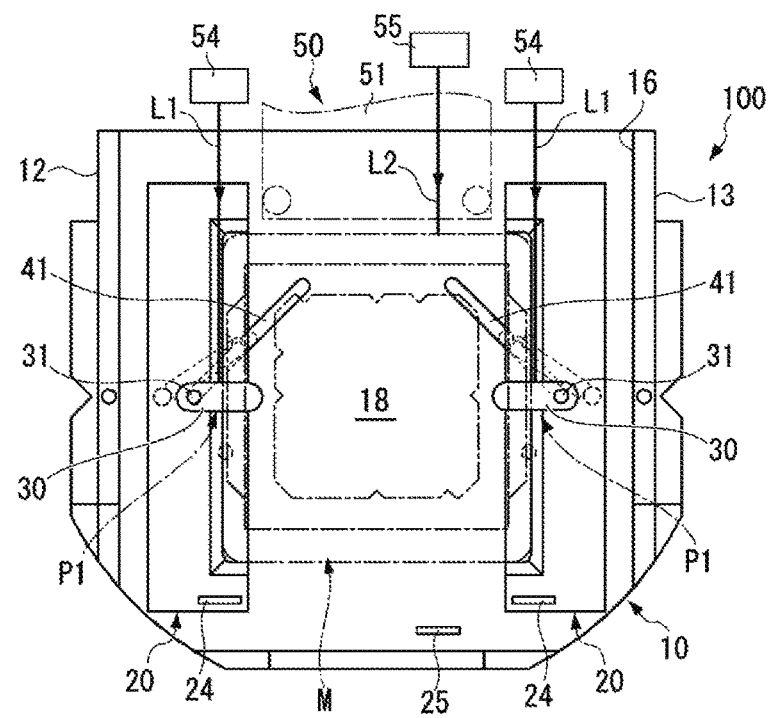
FIGS. 3A and 3B are plan views illustrating an example of an operation of a detector, where
Figure 3B:
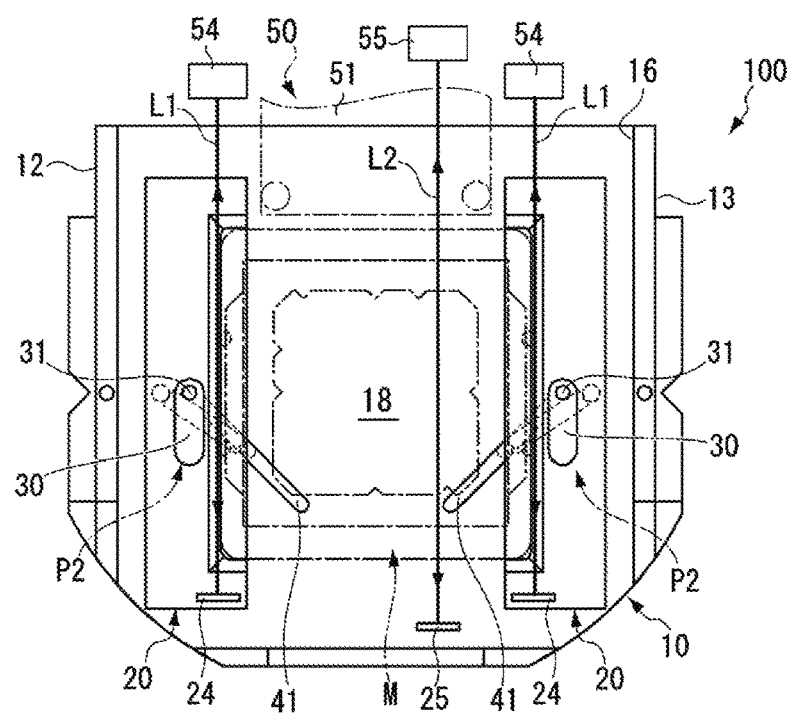

FIGS. 3A and 3B are views illustrating an example of a detection operation performed by the detector 54. As illustrated in FIG. 3A, when the regulator 30 is disposed in the advanced position P1, the detection light L1 emitted from the light emitter is blocked by the regulator 30. In this case, the detection light L1 does not reach the light reflector 24. Since the light receiver does not receive the detection light L1, the detector 54 does not transmit the light reception signal to the controller 80. When the light reception signal indicating detection of the detection light L1 is not transmitted from the detector 54, the controller 80 determines that the regulator 30 is disposed in the advanced position P1. Note that a reflection preventive film may be provided or rough surface treatment or the like may be performed on the regulator 30 so as not to reflect the detection light L1.

When the stored object M is placed in the storage portion 18, the detection light L2 emitted from the light emitter of the stored object detector 55 is blocked by the stored object M. In this case, the detection light L2 does not reach the light reflector 25. Since the light receiver does not receive the detection light L2, the stored object detector 55 does not transmit the light reception signal to the controller 80. When the light reception signal indicating detection of the detection light L2 is not transmitted from the stored object detector 55, the controller 80 determines that the stored object M is placed in the storage portion 18. Note that a reflection preventive film may be provided or rough surface treatment or the like may be performed on the side surface of the stored object M so as not to reflect the detection light L2.

Next, as illustrated in FIG. 3B, when the regulator 30 is disposed in the retracted position P2, the detection light L1 emitted from the light emitter of the detector 54 reaches the light reflector 24. As a result, the detection light L1 is reflected by the light reflector 24 and reaches the light receiver. By the light receiver receiving the detection light L1, the detector 54 transmits the light reception signal indicating detection of the detection light L1 to the controller 80 (cf. FIG. 2). When receiving the light reception signal from the detector 54, the controller 80 determines that the regulator 30 is disposed in the retracted position P2. When the stored object M is not placed in the storage portion 18, the detection light L2 emitted from the light emitter of the stored object detector 55 reaches the light reflector 25. As a result, the detection light L2 is reflected by the light reflector 25 and reaches the light receiver. By the light receiver receiving the detection light L2, the stored object detector 55 transmits the light reception signal indicating detection of the detection light L2 to the controller 80. When receiving the light reception signal from the stored object detector 55, the controller 80 determines that the stored object M is not placed in the storage portion 18.

Next, the operation of the transfer system SYS illustrated in FIG. 2 will be described. The controller 80 controls each operation of the transfer system SYS. FIG. 3 is a flowchart illustrating an example of an operation to store the stored object M into the transport container 100. An operation described below is an example of a preferred embodiment of a transfer method for the stored object M. Note that at the time of storing the stored object M into the transport container 100, the regulator 30 of the transport container 100 is previously disposed in the retracted position P2. Since the operation lever 41 is held in contact with the retract-side contact portion 42b by elastic force of the elastic member 43a, the regulator 30 is held in the retracted position P2.

First, as illustrated in FIG. 3, whether or not the stored object M is in the transport container 100 is confirmed (Step S01). When the controller 80 does not receive a light reception signal of the stored object detector 55, that is, when the stored object M is in the transport container 100 (YES in Step S01), the controller 80 stops the transport operation as an error (Step S02). The stored object M has already been placed in the storage portion 18 of the transport container 100, and the stored object M thus cannot be transferred to this storage portion 18. When the transport operation is stopped, a warning or the like may be issued to an operator by using a sound, blinking of light, or the like.

Next, when the controller 80 receives a light reception signal of the stored object detector 55, that is, when the stored object M is not in the transport container 100 (NO in Step S01), the controller 80 confirms whether or not the regulator 30 is disposed in the advanced position P1 (Step S03). In Step S03, the controller 80 may, for example, set the height of the arm 51 to such a height as to allow the detector 54 to detect the regulator 30. In this state, the controller 80 may cause the detector 54 to be driven and confirm whether or not the regulator 30 is disposed in the advanced position P1. Based on whether or not the light reception signal is received from the detector 54, the controller 80 determines whether or not the regulator 30 is in the advanced position P1.

When determining that the regulator 30 is disposed in the advanced position P1, that is, when not receiving the light reception signal from the detector 54 (YES in Step S03), the controller 80 stops the transport operation as an error (Step S02). When the transport operation is stopped, a warning or the like may be issued to an operator by using a sound, blinking of light, or the like. Further, in accordance with this warning or the like, for example, the operator may manually move the regulator 30 to the retracted position P2.

When determining that the regulator 30 is not disposed in the advanced position P1, that is, when receiving the light reception signal from the detector 54 (NO in Step S03), the controller 80 causes the stored object M to be placed on the arm (Step S04). The controller 80 confirms that the stored object M is in a predetermined position of the stored object transporter 60, and then causes the arm 51 of the transfer device 50 to be raised so as to lift the stored object M from the stored object transporter 60. The stored object M is thus placed on the arm 51. A plurality of positioning pins are provided on the upper surface of the arm 51, and the positioning pin enters the state of being fitted in a groove on the bottom surface of the stored object M. The stored object M is thus positioned on the arm 51.

Next, the controller 80 sets the height of the arm 51 to a predetermined height (e.g., a height at which the detector 54 is set in accordance with the regulator 30). Note that it is freely selected to confirm whether or not the stored object M is in the transport container 100 and whether or not the regulator 30 is disposed in the advanced position P1. Hence neither Step S01 nor Step S02 may be executed in the flowchart of FIG. 3.

Figure 5A:
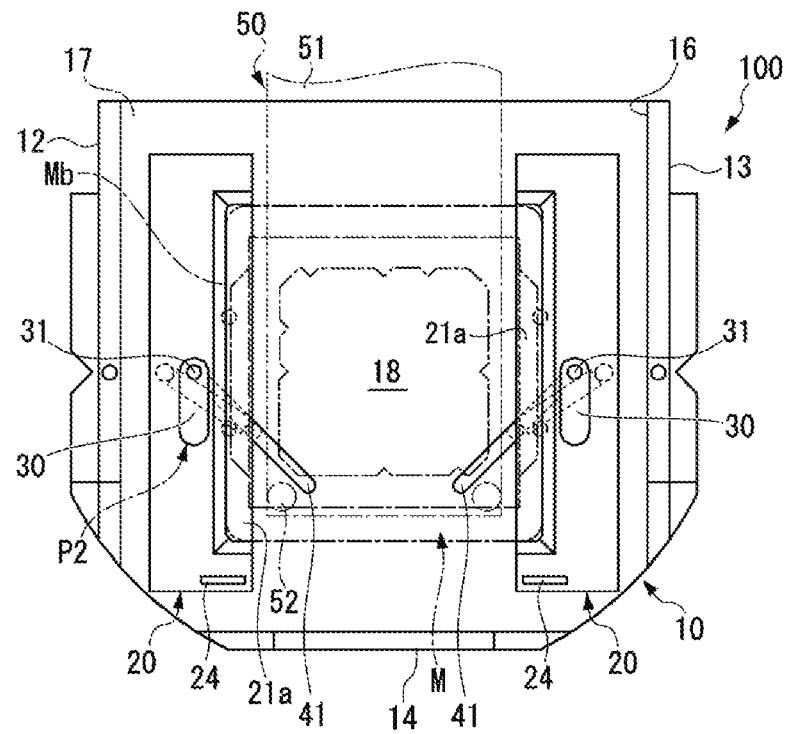
FIGS. 5A and 5B are views illustrating a state where a stored object placed on an arm of the transfer device has entered inside the transport container.
Figure 5B:
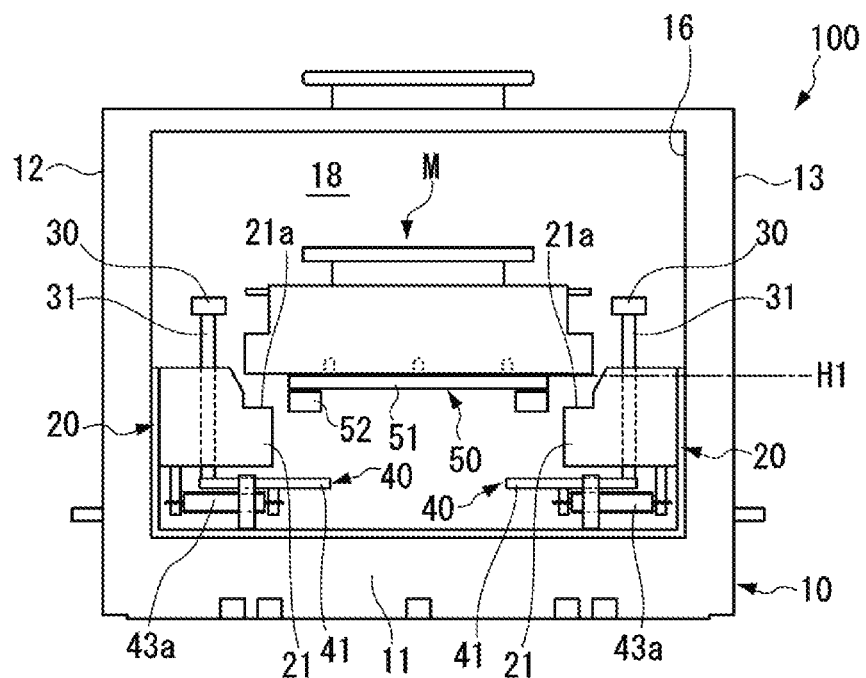

Subsequently, after Step S04, the arm 51 is inserted into the storage portion 18 as illustrated in FIGS. 5A and 5B (Step S05). The controller 80 moves the body 53 of the transfer device 50 horizontally (cf. FIG. 2) to move the arm 51 horizontally. Further, the controller 80 adjusts the insertion position of the arm 51 above the positioner 20 and such that the stored object M is located in a portion surrounded by the positioner 20 in plan view. When the arm 51 is disposed in this position, the roller 52 is located closer to the back surface 14 than the operation lever 41 is. Further, the height of the arm 51 is set on a support level H1. The support level H1 is a height position above the placement surface 21a.

Figure 6A:
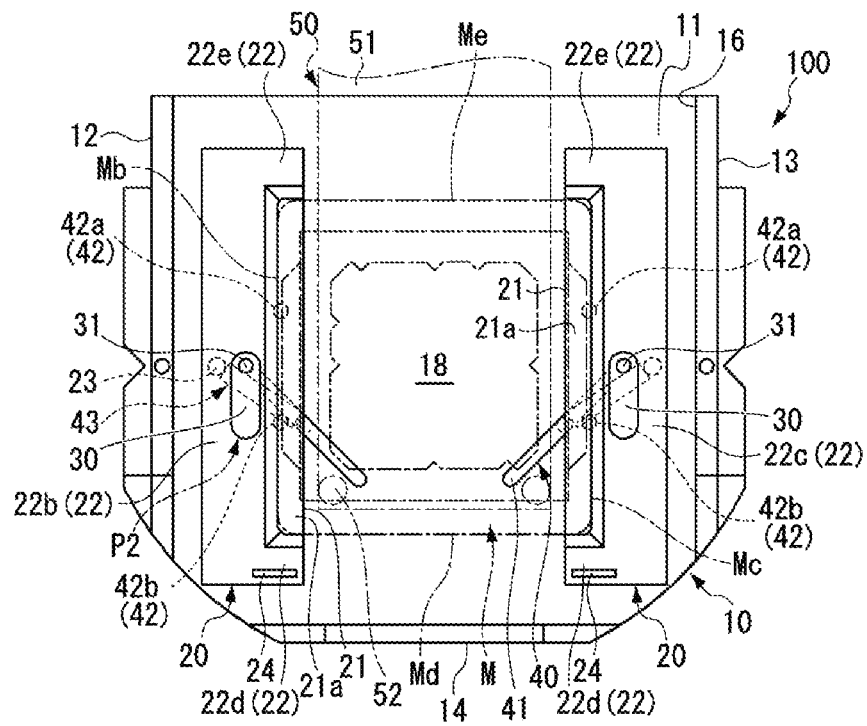
FIGS. 6A and 6B are views illustrating a state where the arm has been lowered to place the stored object in a storage portion.
Figure 6B:
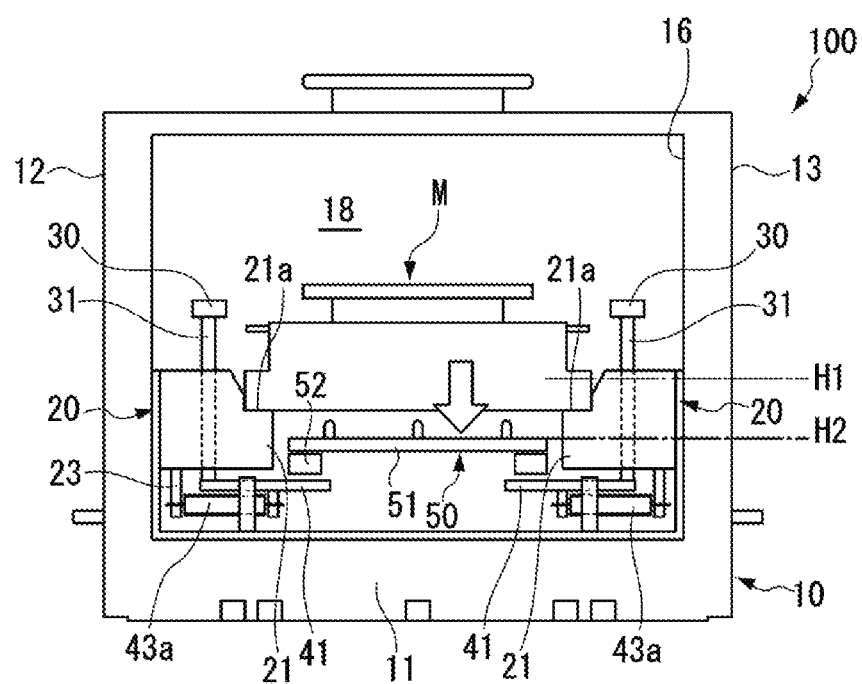

Next, the arm 51 is lowered to place the stored object M on the placement surface 21a (Step S06). The controller 80 causes the arm 51 from the support level H1 to dispose the arm 51 on an intermediate level H2 as illustrated in FIGS. 6A and 6B. The intermediate level H2 is a position where the upper surface of the arm 51 is lower than the placement surface 21a and the roller 52 is higher than the operation lever 41. During lowering of the arm 51 from the support level H1 to the intermediate level H2, the stored object M is placed on the placement surface 21a.

Figure 7A:
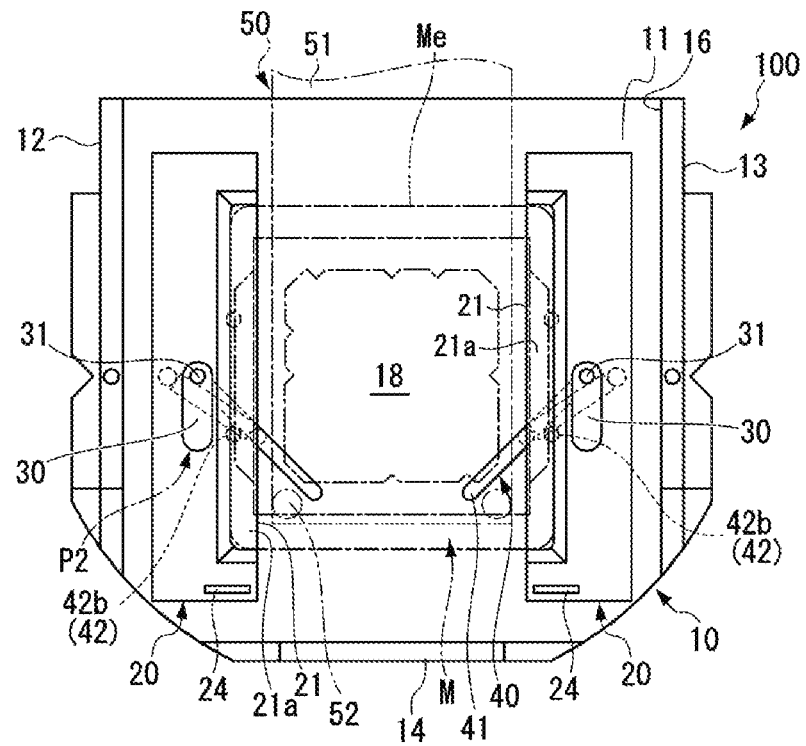
FIGS. 7A and 7B are views illustrating a state where the arm has been further lowered.
Figure 7B:
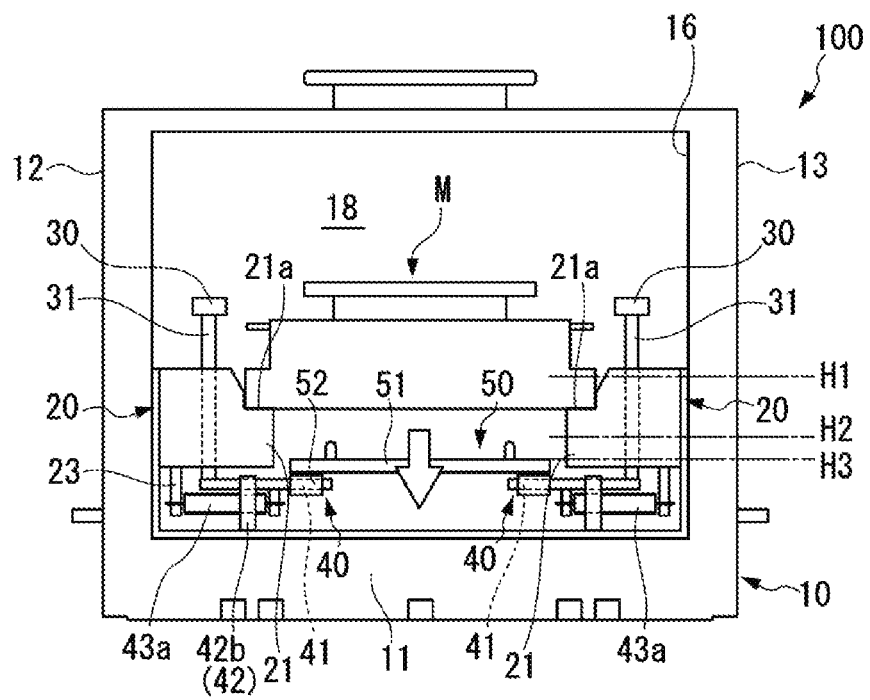

Next, the arm 51 is lowered to be disposed at an operation level H3 (Step S07). As illustrated in FIGS. 7A and 7B, the controller 80 causes the arm 51 to be lowered from the intermediate level H2 to the operation level H3. The operation level H3 is a position below the intermediate level H2 and a position where the roller 52 can make contact with the operation lever 41. When the arm 51 is on the operation level H3, the roller is disposed closer to the back surface 14 of the transport container 100 than the operation lever 41 is.

Figure 8A:
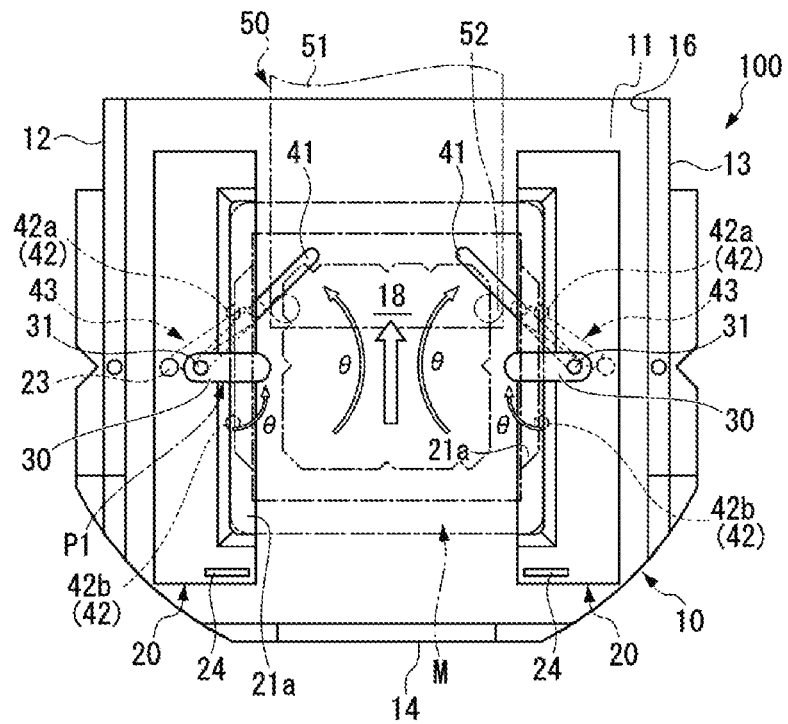
FIGS. 8A and 8B are views illustrating a state where an operation member has been operated by the arm.
Figure 8B:
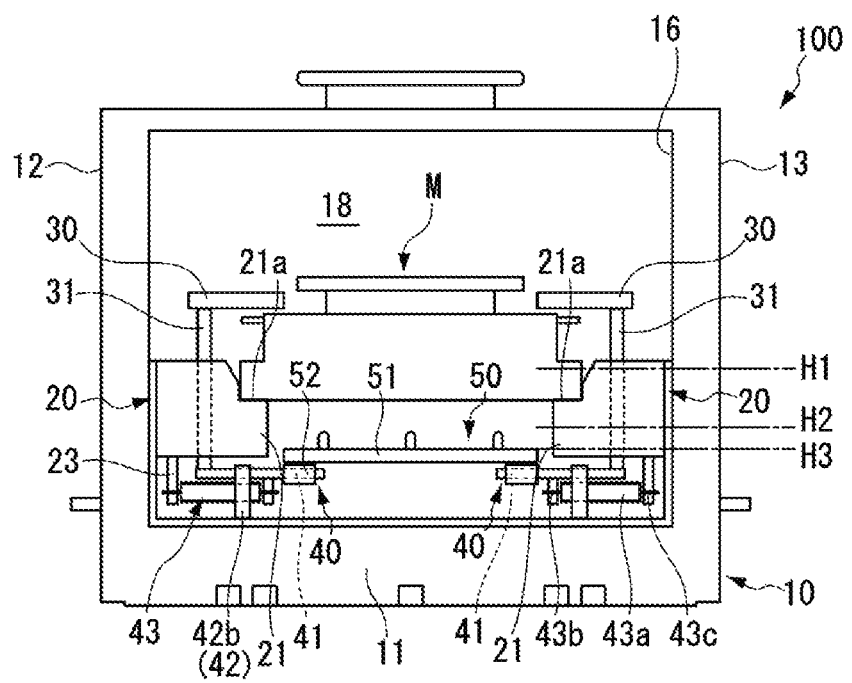

Next, the arm 51 is withdrawn from the transport container 100 to dispose the regulator 30 in the advanced position P1 (Step S08). The controller 80 moves the transfer device 50 horizontally (cf. FIG. 2) to withdraw the arm 51 from the transport container 100. At this time, as illustrated in FIGS. 8A and 8B, the roller 52 moves so as to pull the operation lever 41 toward the opening 16. The operation lever 41 thus rotates in the θ-direction around the shaft member 31.

With the rotation of the operation lever 41, the regulator 30 turns in the θ-direction and moves from the retracted position P2 to the advanced position P1. Note that the operation lever 41 comes into contact with the advance-side contact portion 42a and is held in that position by elastic force of the elastic member 43a. Hence, the regulator 30 is in the state of being held in the advanced position P1. The regulator 30 is disposed in the advanced position P1 to regulate vertical movement of the stored object M. Accordingly, the stored object M is able to be prevented from falling from the placement surface 21a (a predetermined position of the storage portion 18) due to shaking, vibration, or the like of the transport container 100.

Next, the withdrawal of the arm 51 is stopped (Step S09). After the arm 51 has caused the operation lever 41 to be rotated by the roller 52 (after the regulator 30 is disposed in the advanced position P1), the controller 80 stops the withdrawal of the arm 51.

Figure 9A:
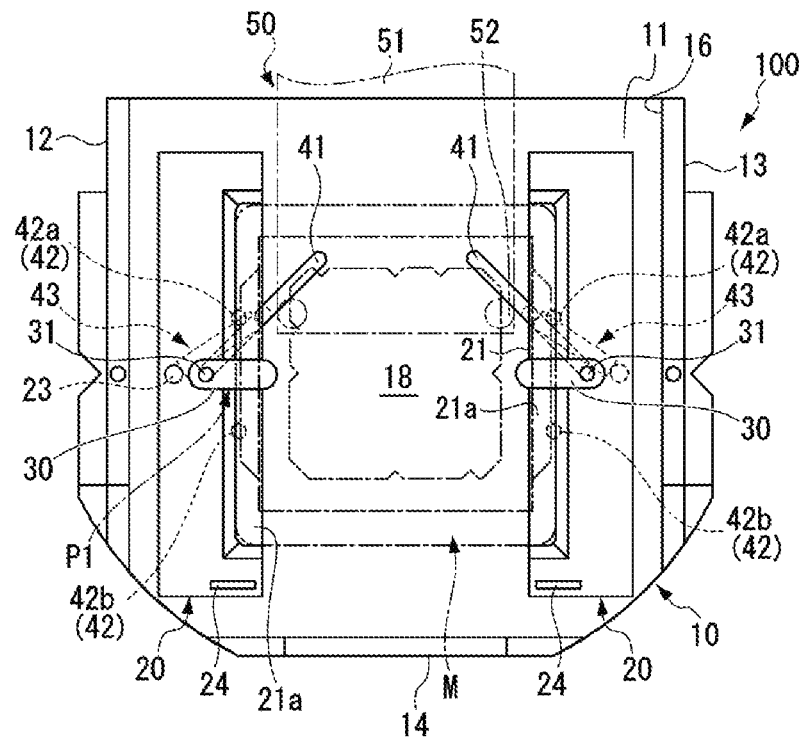
FIGS. 9A and 9B are views illustrating a state where the arm has been lifted.
Figure 9B:
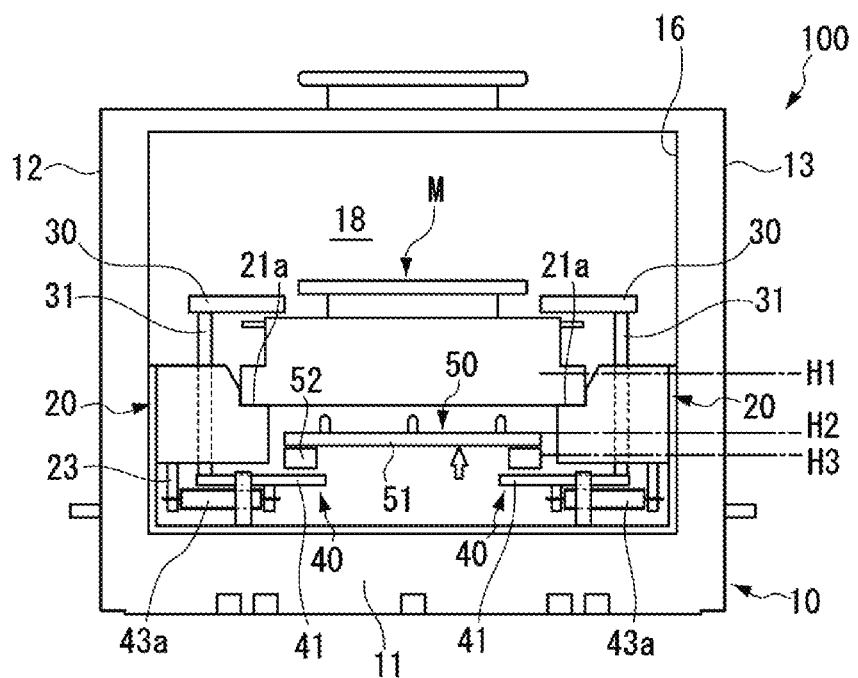

Next, the arm 51 is lifted to be disposed on the intermediate level H2 (Step S10). As illustrated in FIGS. 9A and 9B, the controller 80 causes the arm 51 to be lifted and disposed on the intermediate level H2 and causes the roller 52 of the arm 51 to be disposed in a position not interfering with the operation lever 41.

Next, the arm 51 is withdrawn from the transport container 100 (Step S11). Since the arm 51 is disposed on the intermediate level H2, the arm 51 is able to be withdrawn from the transport container 100 without interfering with the stored object M or the operation lever 41. As described above, the operation to store the stored object M into the transport container 100 is completed. After completion of the transfer of the stored object M, the detector 54 may confirm whether or not the regulator 30 is disposed in the advanced position P1. At this time, when it is confirmed that the regulator 30 is not disposed in the advanced position P1, the controller 80 may issue a warning or the like. However, whether or not such confirmation is made after transfer of the stored object M is freely selected.

Figure 10:
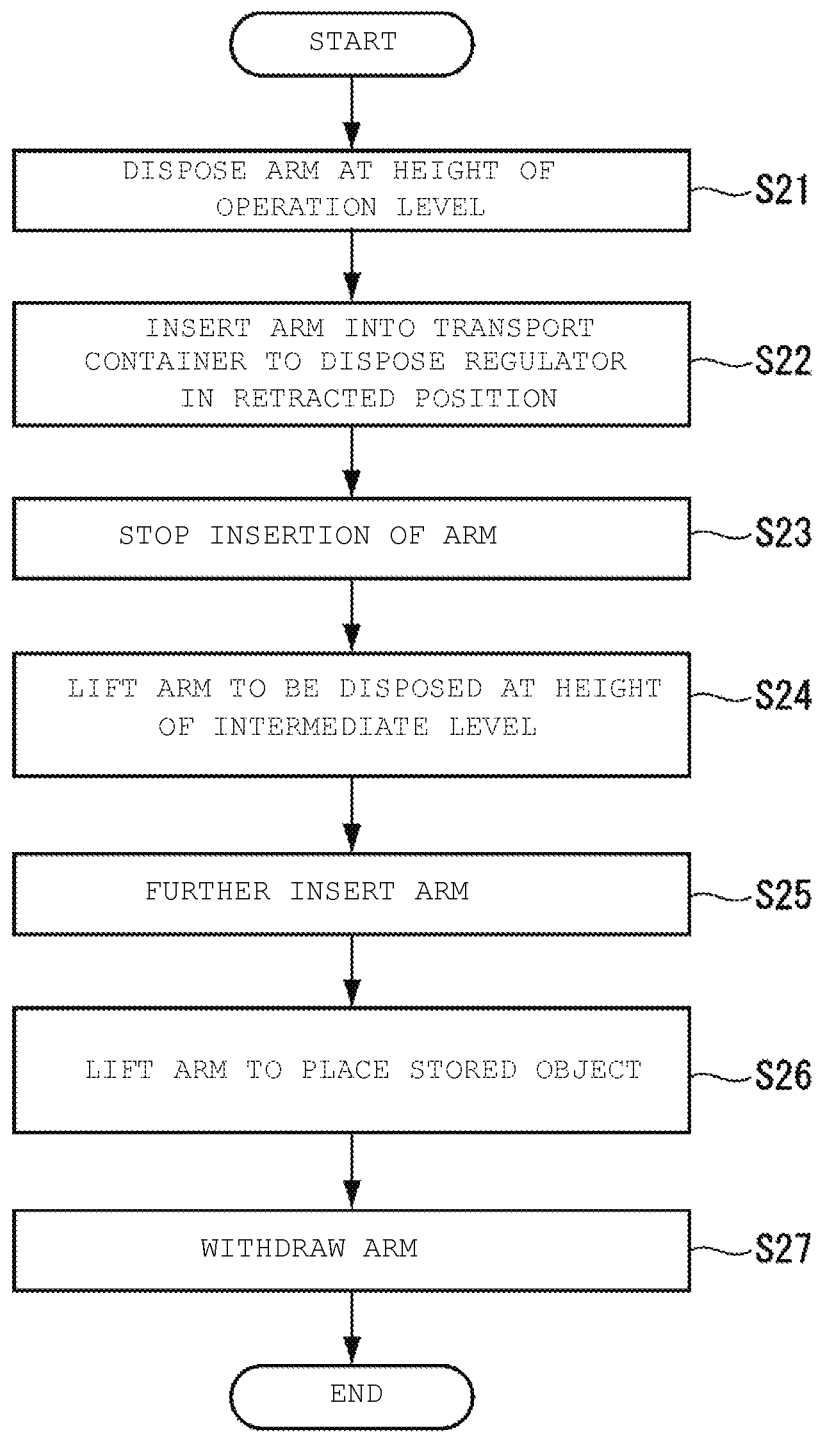
FIG. 10 is a flowchart illustrating an example of an operation to take the stored object out.

Subsequently, the operation to take the stored object M out of the transport container 100 will be described. FIG. 10 is a flowchart illustrating an example of an operation to take the stored object M out of the transport container 100 by the transfer system SYS. In the following, a description will be given by taking as an example a case in which the stored object M is taken out from the state where the stored object M is stored in the transport container 100, that is, the state after Step S11 is performed (the state where the regulator 30 is disposed in the advanced position P1).

Figure 11A:
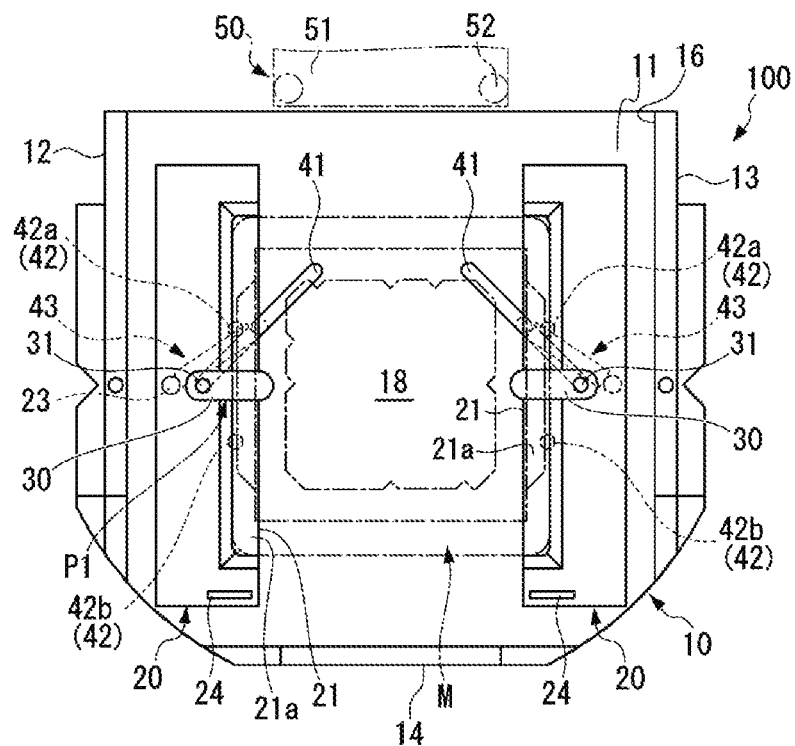
FIGS. 11A and 11B are views illustrating a state where the arm of the transfer device has entered below the stored object.
Figure 11B:
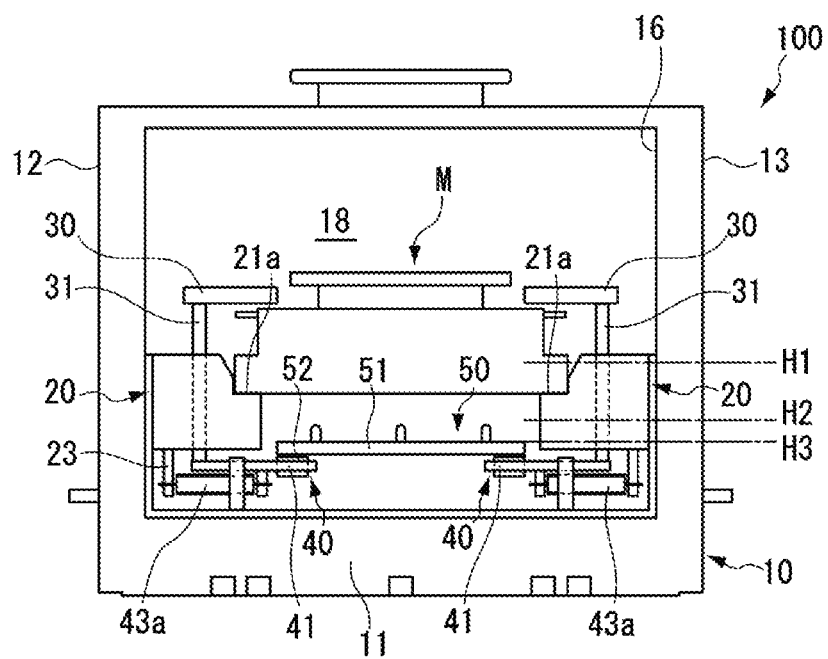

First, the arm 51 of the transfer device 50 is disposed at the height of the operation level H3 (Step S21). As illustrated in FIGS. 11A and 11B, the controller 80 causes the arm 51 of the transfer device 50 to be lifted or lowered so as to be disposed at the height of the operation level H3. Note that, prior to Step S21, the detector 54 may confirm whether or not the regulator 30 is disposed in the advanced position P1. When the regulator 30 is not disposed in the advanced position P1, the controller 80 may issue a warning or the like.

Next, the arm 51 is inserted into the transport container 100 to dispose the regulator 30 in the retracted position (Step S22). As illustrated in FIGS. 12A and 12B, the controller 80 causes the arm 51 to be inserted into the transport container 100 and causes the operation lever 41 to be pushed by the roller 52 in an inserting direction. The operation lever 41 thus rotates in the θ-direction around the shaft member 31.

By the insertion of the arm 51, the operation lever 41 rotates in the θ-direction toward the back surface 14, comes into contact with the retract-side contact portion 42b, and is held at that position by elastic force of the elastic member 43a. With the rotation of the operation lever 41, the regulator 30 turns in the same θ-direction as above to be disposed in the retracted position P2 from the advanced position P1. By disposing the regulator 30 in the retracted position P2, the space above the stored object M is opened. This enables the stored object M to move upward.

Next, the insertion of the arm 51 is stopped (Step S23). The controller 80 confirms that the body 53 (cf. FIG. 2) of the transfer device 50 has moved by a predetermined distance and then stops the movement of the body 53. The arm 51 thus stops in the position illustrated in FIGS. 12A and 12B. Note that the operation lever 41 comes into contact with the retract-side contact portion 42b and is held by elastic force of the elastic member 43a. The regulator 30 is thus held in the state of being disposed in the retracted position P2. Subsequently to step S23, the detector 54 may confirm that the regulator 30 is in the retracted position P2.

Figure 13A:
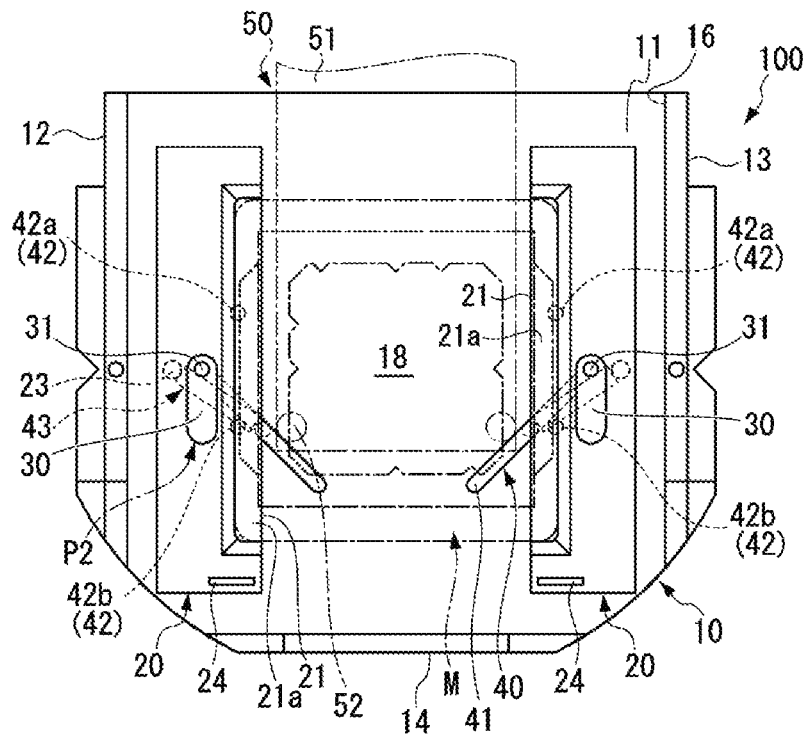
FIGS. 13A and 13B are views illustrating a state where the arm has been lifted.
Figure 13B:
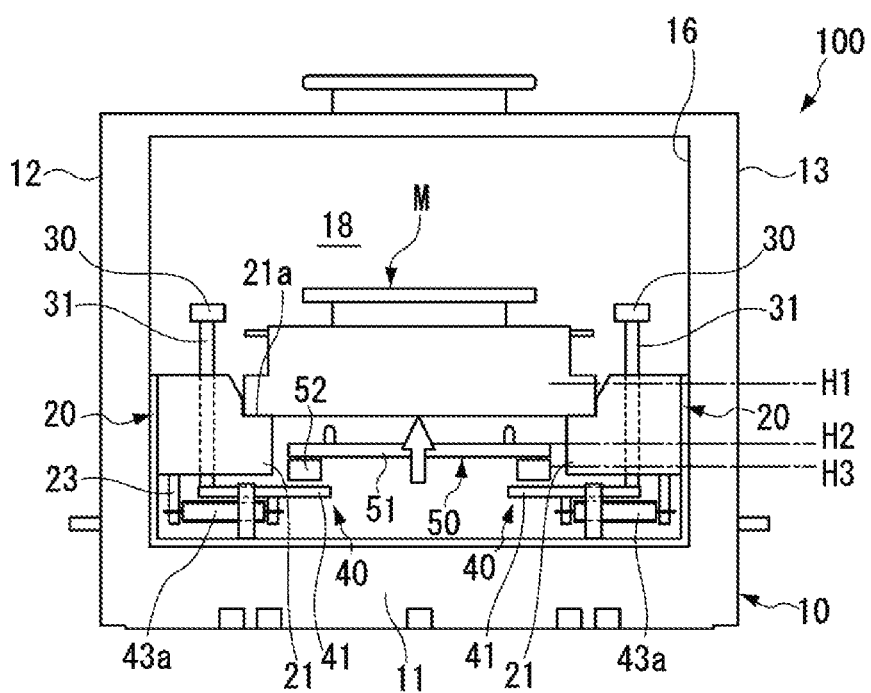

Next, the arm 51 is lifted to be disposed at the height of the intermediate level H2 (Step S24). As illustrated in FIGS. 13A and 13B, the controller 80 causes the arm 51 to be lifted and disposed at a height where the roller 52 does not interfere with the operation lever 41.

Figure 14A:
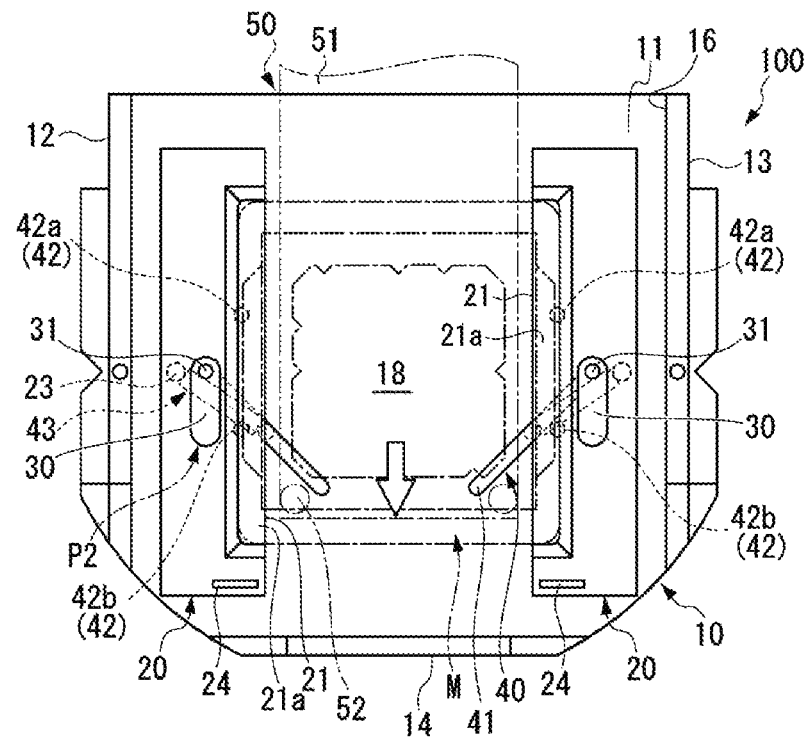
FIGS. 14A and 14B are views illustrating a state where the arm has further entered.
Figure 14B:
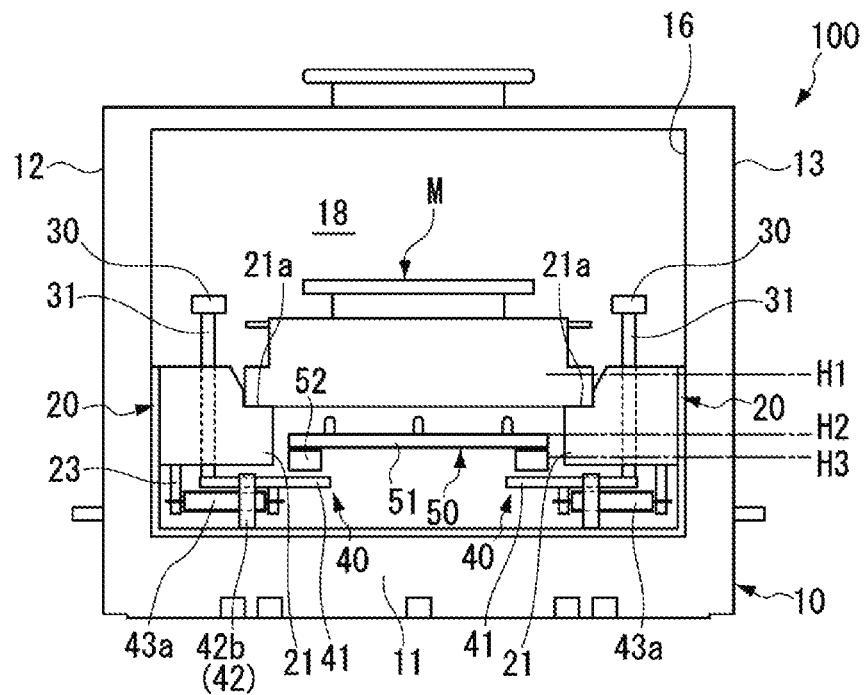

Next, the arm 51 is further inserted toward the back surface 14 (Step S25). As illustrated in FIGS. 14A and 14B, the controller 80 inserts the arm 51 to a position where the stored object M is supported. Since the arm 51 is at the height of the intermediate level H2 in Step S24 described above, the roller 52 moves without coming into contact with the operation lever 41.

Figure 15A:
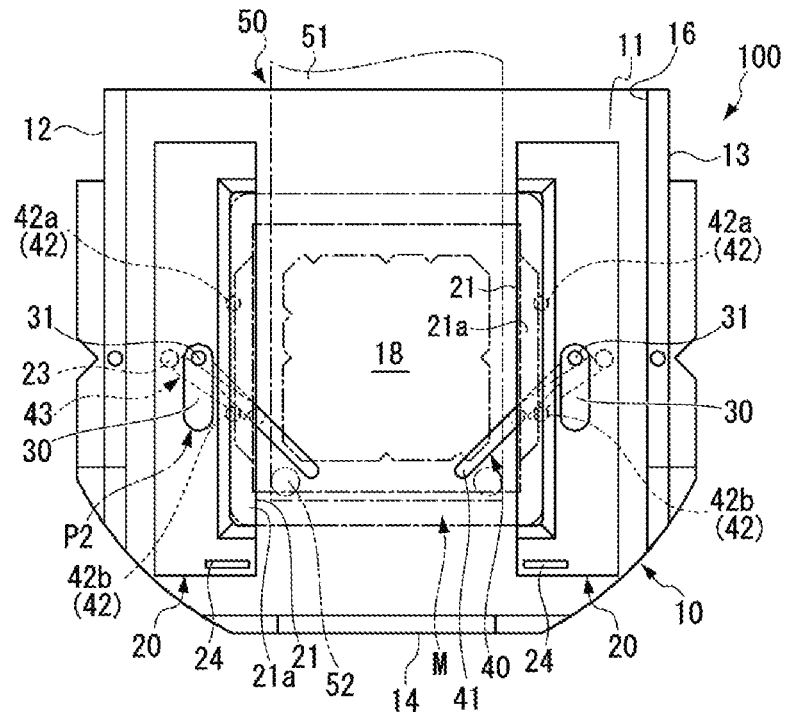
FIGS. 15A and 15B are views illustrating a state where the arm has been further lifted to place the stored object.
Figure 15B:
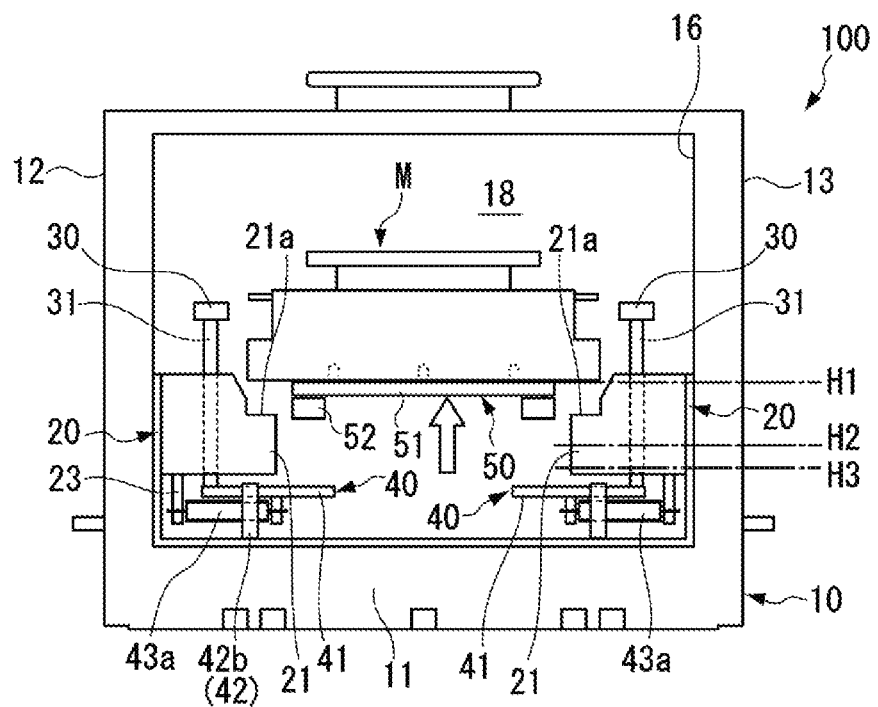

Next, the arm 51 is lifted and the stored object M is disposed on the upper surface of the arm 51 (Step S26). The controller 80 causes the arm 51 to be lifted from the intermediate level H2 toward the support level H1. By lifting the stored object M placed on the placement surface 21a in the middle of lifting of the arm 51, the stored object M is placed on the arm 51 as illustrated in FIGS. 15A and 15B.

Next, the arm 51 placed with the stored object M is withdrawn from the transport container 100 (Step S27). The controller 80 causes the body 53 of the transfer device 50 to move so that the arm 51 is withdrawn from the transport container 100. Note that lowering of the arm 51 subsequently to Step S27 enables the stored object M placed on the arm 51 to be transferred to a predetermined position (e.g., on a roller for transport) of the stored object transporter 60. As described above, the operation to take the stored object M out of the transport container 100 is completed.

As thus described, in the transport container 100 according to a preferred embodiment of the present invention, disposing the regulator 30 in the retracted position P2 enables the stored object M to be taken in and out. Further, by disposing the regulator 30 in the advanced position P1, the stored object M is able to be easily and reliably prevented from falling from the storage portion 18 due to shaking, vibration, or the like of the transport container 100 during transport of the transport container 100 or the like. Moreover, although each of the steps in FIGS. 4 and 10 is preferably performed by the controller 80 in the above description, the present invention is not limited thereto. Some or all of the steps in FIGS. 4 and 10 may be performed by manual operation by the operator.

Although the preferred embodiments have been described above, the present invention is not limited to the above description, and a variety of changes can be made within the scope not deviating from the gist of the present invention. For example, the positioner 20 provided in the transport container 100 is not limited to the illustrated shape, and any shape is applicable as long as the transport container 100 is able to be held horizontally.

In the above preferred embodiments, the configuration has been described in which the regulator 30 preferably is turned in the θ-direction around the shaft member 31, but the present invention is not limited thereto. For example, the regulator 30 may be horizontally slidable. In this case, any mechanism is applied to slide the regulator 30 by rotation of the operation lever 41.

In the above preferred embodiments, the description has been given by taking, as an example, the configuration in which the detector 54 preferably is disposed in the arm 51, but the present invention is not limited thereto. For example, one or both of the light emitter and the light receiver of the detector 54 may be provided in the body 53 of the transfer device 50 or may be provided in the transport container 100.

In the above preferred embodiments, the description has been given by taking, as an example, the configuration in which the detection light L emitted from the detector 54 is blocked in the advanced position P1, and the detection light L is allowed to pass in the retracted position P2, but the present invention is not limited thereto. For example, it may be configured such that the detection light L is reflected by the regulator 30 in the advanced position P1 and received in the light receiver of the detector 54, and the reflection of the detection light L is prevented or reduced in the retracted position P2. The detector 54 is not limited to detecting both the advanced position P1 and the retracted position P2, but may be able to detect one of those positions.

In the above preferred embodiments, the description has been given by taking, as an example, the configuration in which the operation member 40 preferably is operated by the arm 51 of the transfer device 50, but the present invention is not limited thereto. A device that operates the operation member 40 may be provided separately from the arm 51. In the above preferred embodiments, the description has been given by taking, as an example, the configuration in which the operation member 40 preferably is operated to dispose the regulator 30 in the advanced position P1 and the retracted position P2, but the present invention is not limited thereto. For example, it may be configured such that the regulator 30 is directly moved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transport container, in which a stored object is taken in and out through an opening on a side surface, the container comprising:
   a container body defining a storage portion;

a positioner provided in the storage portion, the positioner projecting upward from an outside of a placement surface located in the storage portion and on which the stored object is placed when the stored object is received from a transfer device that takes the stored object into and out of the storage portion; and a regulator provided in the storage portion, the regulator being movable between an advanced position, in which the regulator is advanced to above the stored object placed on the placement surface to regulate upward movement of the stored object, and a retracted position, in which the regulator is retracted from above the stored object to allow upward movement of the stored object.

2. The transport container according to claim 1, wherein the regulator moves or turns between the advanced position and the retracted position above the positioner.

3. The transport container according to claim 1, further comprising an operator that is connected to the regulator and moves the regulator to the advanced position or the retracted position.

4. The transport container according to claim 3, wherein the operator is operated by the transfer device that takes the stored object into and out of the storage portion.

5. The transport container according to claim 4, wherein the operator is disposed below a height of the transfer device that takes the stored object in and out.

6. The transport container according to claim 4, further comprising an elastic member that elastically supports the operator and holds the regulator in the advanced position or the retracted position.

7. The transport container according to claim 4, wherein the regulator in at least one of the advanced position and the retracted position is detected by a detector of the transfer device.

8. The transport container according to claim 7, wherein the regulator blocks detection light, which is emitted from the detector, in the advanced position, and allows the detection light to pass in the retracted position.

9. The transport container according to claim 8, further comprising a reflector that reflects the detection light, which is allowed to pass, when the regulator is in the retracted position.

* * * * *